United States Patent
Ashton et al.

(10) Patent No.: US 7,543,203 B2
(45) Date of Patent: Jun. 2, 2009

(54) LSSD-COMPATIBLE EDGE-TRIGGERED SHIFT REGISTER LATCH

(75) Inventors: Gerry Ashton, Castleton, VT (US); Kevin A. Duncan, Milton, VT (US); Terry D. Keim, Williston, VT (US); Toshiharu Saitoh, South Burlington, VT (US); Tad J. Wilder, South Hero, VT (US)

(73) Assignee: International Business Machines Corporation, Armonk, NY (US)

( * ) Notice: Subject to any disclaimer, the term of this patent is extended or adjusted under 35 U.S.C. 154(b) by 977 days.

(21) Appl. No.: 10/708,382

(22) Filed: Feb. 27, 2004

(65) Prior Publication Data

US 2005/0204244 A1 Sep. 15, 2005

(51) Int. Cl.
*G01R 31/28* (2006.01)
(52) U.S. Cl. .................................... 714/726
(58) Field of Classification Search .......... 714/100–824
See application file for complete search history.

(56) References Cited

U.S. PATENT DOCUMENTS

| | | | | |
|---|---|---|---|---|
| 5,621,739 | A | * | 4/1997 | Sine et al. ................ 714/724 |
| 6,069,829 | A | * | 5/2000 | Komai et al. ............. 365/201 |
| 7,127,695 | B2 | * | 10/2006 | Huang et al. .............. 716/10 |

* cited by examiner

*Primary Examiner*—Cynthia Britt
*Assistant Examiner*—Guerrier Merant
(74) *Attorney, Agent, or Firm*—Downs Rachlin Martin PLLC

(57) ABSTRACT

A shift register latch (SRL) (300, 304, 400) compatible with performing level sensitive scan design (LSSD) testing with a single scan clock (SCAN CLK) and single scan clock tree (64). The SRL includes a master latch (308, 308', 404), a slave latch (312, 312', 408) and a circuit element (328, 328', 416) connected between the scan clock tree and the master latch. The scan clock generates a clock signal (350, 440) having regularly spaced pulses during the scan phase of the LSSD testing. The circuit element generates a short-pulsed signal (354, 354') based on the scan clock signal for triggering the master latch. This short-pulsed signal compensates for any delay in the clock signal due to the physical length of the signal path from the scan clock to the SRL, thereby preventing scanned data from being flushed through a scan chain of the SRLs of the present invention

20 Claims, 7 Drawing Sheets

LSSD-COMPATIBLE EDGE-TRIGGERED SHIFT REGISTER LATCH

BACKGROUND OF INVENTION

Field of the Invention

The present invention relates generally to the field of microelectronics. More particularly, the present invention is directed to an LSSD-compatible edge-triggered shift register latch.

BACKGROUND

As the scale of semiconductor integrated circuit integration keeps increasing, devising testing methodologies and circuits for testing these integrated circuits becomes more and more challenging. A presently widely-used methodology for testing various circuitry, including combinational logic, SRAMs, RA's and embedded macros, among others, is the level-sensitive scan design (LSSD) methodology that utilizes boundary scan shift register latches (SRLs) to scan test data into the circuitry under test and scan the output of the circuitry. The scanned output is then compared to a set of expected data outs to determine whether or not the circuitry is functioning properly.

FIG. 1 illustrates a conventional LSSD methodology 20 that utilizes a scan chain 24 of the SRLs 28 and three LSSD-dedicated clock trees, an A-clock tree 32, a B-clock tree 36 and a C-clock tree 40, for scanning test data into combinational logic or other circuitry (not shown). Each SRL 28 generally includes a master latch 44 and a slave latch 48. Each master latch 44 can be, e.g., a two port latch having one data port D1 and one scan-in port SI. Conventionally, C-clock tree 40 is for a C-clock (not shown), or data clock, that activates data ports D1, A-clock tree 32 is for an A-clock (not shown), or shift clock, that activates scan-in ports SI of master latch and B-clock tree 36 is for a B-clock (not shown), or slave latch clock, that activates slave latches 48 after master latches 44 have latched the corresponding shift values. During LSSD testing, the A-clock and B-clock are non-overlapping and enable the proper shifting of scan data into master latch 44 of each SRL 28 and out of data output port D0 of each slave latch 48. During the test's system cycle phase, the B-clock launches the test data from slave latch 48. A subsequent C clock pulse captures the test response in all of SRLs 28.

In addition to LSSD clock trees 32, 36, 40, a functional clock tree 52 is present for providing SRLs 28 with a clock for functional operation, as opposed to test operation, of the SRLs. Clock trees 36, 40, 52, are typically connected to SRLs via one or more clock splitters 56. With present very large scale integration, the relatively large amount of wiring required for clock trees 32, 36, 40, 52 is gating the circuit count size in various types of chips, such as application specific integrated circuit (ASIC) chips and system on chip (SOC) chips. Each generation of integrated circuit technology requires at least one additional metal layer to maintain wireability. Providing such additional metal layer(s) adds to the cost of fabricating chips. It would, therefore, be highly desirable to minimize the amount of wiring necessary to implement an LSSD testing methodology.

In this connection, it would be beneficial to eliminate the need to have three clock trees and associated clock splitters for LSSD testing. This would save significant on-chip space for other uses. FIG. 2 shows an LSSD testing methodology 60 that replaces A-clock, B-clock and C-clock trees 32, 36, 40 of FIG. 1 with a single LSSD scan clock tree 64. With the elimination of two clock trees and corresponding clock splitters, a relatively large amount of wiring is eliminated freeing up space on the metal layers and/or reducing the need for additional wiring layers.

Unfortunately, as illustrated in FIG. 3, there is a known problem with having only one LSSD scan clock tree 64 controlling the scanning of test data into the scan chain 24' of SRLs 28'. Generally, the problem is caused by the differences in the lengths that the signal from the LSSD scan clock (not shown) must travel to each SRL 28'. Due to such variations in signal path length, master and slave latches 44', 48' of the various SRLs 28' are not triggered exactly at the same time as one another. Rather, master and slave latches 44', 48' of SRLs 28', having relatively long clock signal paths (illustrated by circuitous wire segment 72), e.g., SRL 68, are triggered slightly after the master and slave latches of the SRLs having a relatively short clock signal path, e.g., SRL 76. When there is a significant delay in the pulse in SRL 68 compared to SRL 76, data captured in master and slave latches 44', 48' of SRL 68 gets flushed through.

As shown in FIG. 3 by the plots of one pulse 80 of the LSSD clock, in SRL 76 at the leading edge 84 of the pulse, the data value X being scanned into the SRL is latched at master latch 44' (output A). At the trailing edge 88 of pulse 80, the data value in master latch 44' (output A) gets latched by slave latch 48' (output B). At SRL 68, however, data is flushed through due to the delay in arrival of pulse 80 at this SRL pulse. This is seen at the trailing edge 88' of pulse 80' in SRL 68. At leading edge 84' of pulse 80, data in slave latch 48' of SRL 76 gets latched to master latch 44' of SRL 68. However, at trailing edge 88', the data in slave latch 48' of SRL 76 gets latched directly to the value in the slave latch (output D) of SRL 68, essentially bypassing master latch 44' of SRL 68. Since data can be lost with such a configuration having only a single scan clock in the manner just described, an LSSD testing methodology using a single test-dedicated clock tree has heretofore, not been implemented in practice.

SUMMARY OF INVENTION

In one aspect, the present invention is directed to an integrated circuit comprising at least one shift register latch. The shift register latch comprises a first latch, a second latch in electrical communication with the first latch and an input for receiving a first clock signal. A circuit connected between the input and the first latch is configured for generating a second clock signal that compensates for any delay in the first clock signal.

In another aspect, the present invention is directed to an integrated circuit comprising a first clock tree for receiving a first clock signal having a plurality of pulses each having a first width. The integrated circuit also comprises at least one first shift register latch that comprises a master latch and a slave latch in electrical communication with the master latch. A circuit element is electrically connected between the first clock tree and the master latch and is adapted for generating a second clock signal as a function of the first clock signal.

BRIEF DESCRIPTION OF DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION

Figure 2:
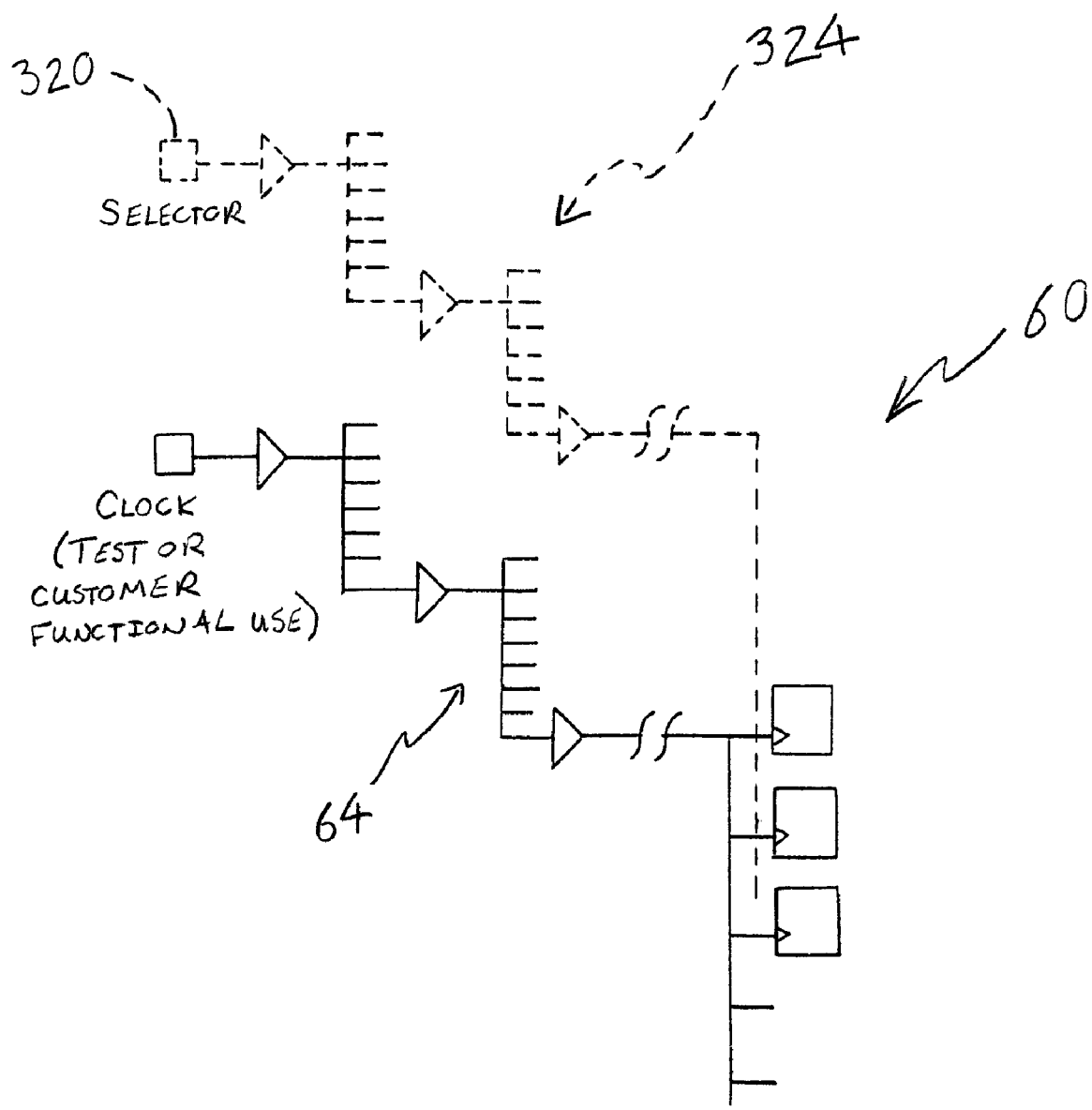
FIG. 2 is a high-level partial schematic diagram illustrating a desirable boundary scan methodology that utilizes only one scan clock tree.
Figure 3:
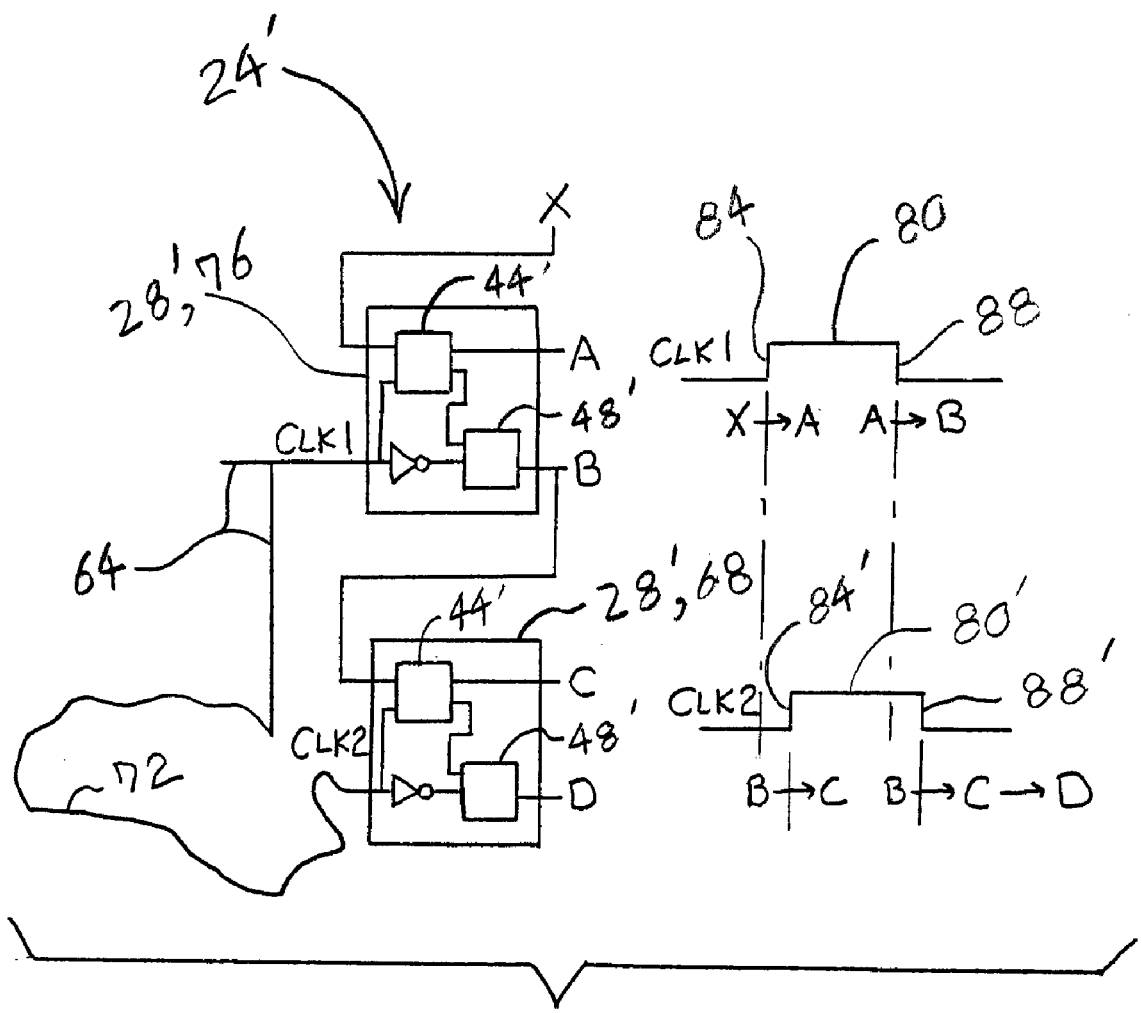
FIG. 3 is a high-level partial schematic diagram illustrating a known problem with implementing the single scan clock methodology of FIG. 2.
Figure 4:
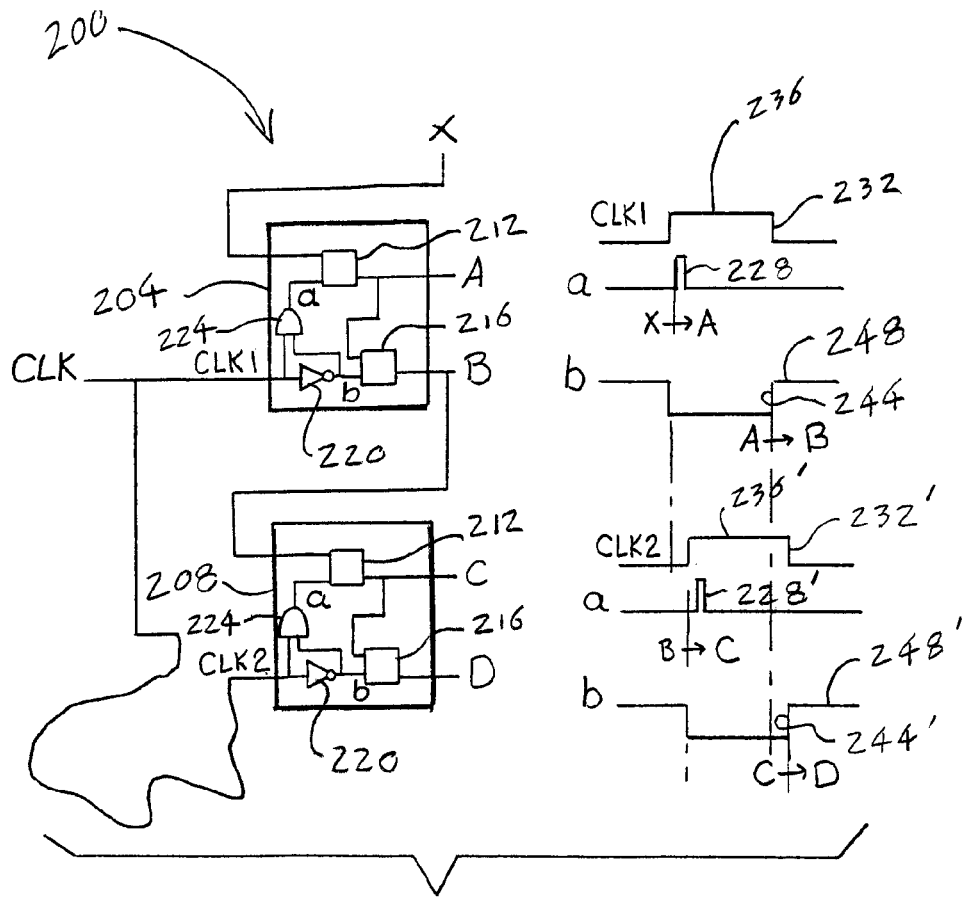
FIG. 4 is a high-level partial schematic diagram partially illustrating edge-triggered shift register latches (SRLs) of the present invention that may be used with the single scan clock methodology of FIG. 2 to eliminate the problem illustrated in FIG. 3.

Referring again to the drawings, FIG. 4 shows a scan chain 200 containing two SRLs 204, 208 of the present invention that each eliminate the flush-through problem discussed above in the Background section in connection with FIGS. 2 and 3 when conventional SRLs, e.g., SRLs 68, 76, are used with only a single LSSD scan clock. Comparing SRLs 204, 208 of FIG. 4 to SRLs 68, 76 of FIG. 3, it is seen that SRLs 204, 208 of the present invention may be largely similar to conventional SRLs, e.g., SRLs 68, 76. That is, each SRL 204, 208 of the present invention may include a master latch 212, a slave latch 216 and an inverter 220 for inverting the signal from the clock CLK as it passes to the slave latch. For illustrative purposes only, SRLs 204, 208 are shown as multiplexer (MUX) type SRLs, but only LSSD scan clock CLK is shown.

As seen in FIG. 4, SRLs 204, 208 of the present invention eliminate the data flush-through problem by incorporating a circuit element 224, e.g., an AND gate, that generates a clock pulse 228, 228', for master latch 212 that is preferably relatively short in duration and does not extend beyond the trailing edge 232, 232' of the corresponding pulse 236, 236' of LSSD scan clock. As a result of pulse 228, 228', the data value in slave latch 216 of SRL 204 is not flushed through master latch 212 of SRL 208 directly to the slave latch of SRL 208, but rather the data value from the slave latch of SRL 204 is properly latched by the master latch of SRL 208. This is shown in the plots of the signals during scanning seen at SRL 204 (clock CLK1) and at SRL 208 (clock CLK2) and clock signals at locations "a", "b" seen by master latches 212 and slave latches 216 of SRLs 204, 208.

Referring to the signal plots for SRL 204, pulse 228 generated as a result of circuit element 224 at "a" occurs very shortly after the leading edge 244 of pulse 236 of clock CLK1 due to the time delay caused by inverter 220 and has a relatively short duration, which in the example shown is the duration it takes pulse-generating circuit element 224, in this case the AND gate, to change states. This short clock pulse 228 causes master latch 212 of SRL 204 to latch scan data input X (output A). Clock pulse 248 at "b" is 180° out of phase with respect to pulse 236 due to inverter 220. On the leading edge of pulse 248, the data value of master latch 212 (output A) is latched by slave latch 216 (output B). A similar sequence of pulses and latching occurs in SRL 208, although at a slight delay relative to SRL 204. That is, in response to pulse 236' of clock CLK2, the data value of slave latch 216 (output B) of SRL 204 is latched to master latch 212 (output C), of SRL 208 and in response to leading edge 244' of pulse 248' at "b" the data value in the master latch (output C) of SRL 208 is latched to the slave latch (output D) of SRL 208.

In general, the pulses 228, 228' generated by circuit elements 224 of SRLs 204, 208 should fall within the corresponding pulse 236, 236' of the respective clock CLK1, CLK2 so that the change in state at the trailing edge of each pulse 228, 228' occurs prior to the change in state at the leading edge 244, 244' of corresponding slave latch signal (b). This will prevent data from being flushed through scan chain 200. Those skilled in the art will appreciate that pulse generating circuit element 224 need not be implemented using an AND gate, but rather may be implemented with any other circuit element(s) that achieve the desired flush-preventing pulses 228 to master latches 212. Generally, circuit element 224 may comprise any one or more circuit components that generates a pulse that turns off before the trailing edge of the respective clock, in this case clocks CLK1 and CLK2. Many types of circuit components can be used to generate such a pulse and it is not necessary to list and describe all alternatives for skilled artisans to understand and appreciate the scope of the present invention.

Figure 5A:
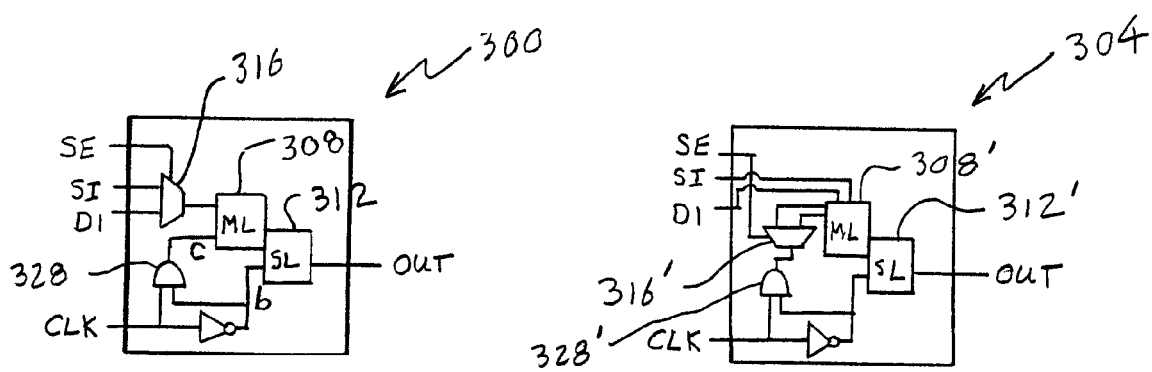
FIGS. 5A and 5B are schematic diagrams of two MUX-type edged-triggered SRLs of the present invention.
Figure 5B:
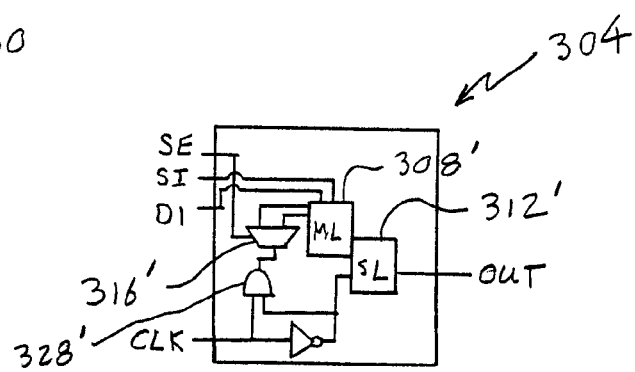

As mentioned above, SRLs of the present invention may be implemented as either a MUX-type or a non-MUX-type SRL, depending upon the particular design of the integrated circuit of which the SRLs are part. FIGS. 5A and 5B illustrate two configurations of MUX-type SRLs 300, 304. Each of SRLs 300, 304 includes a master latch 308, 308', a slave latch 312, 312' and a deMUX 316, 316'. In order to select the proper output of MUX 316 and deMUX 316', each MUX/deMUX includes a selector input SE, which, as shown in FIG. 2, may be connected to a selector pad 320 via a selector tree 324. In MUX 316 of FIG. 5A selector SE selects between scan-in data port SI or functional data port D1, depending upon whether SRL 300 is in scan mode or functional mode. In deMUX 316' of FIG. 5B, selector input is provided for selecting between scan clock or a functional clock (CLK may also be used for both the scan and functional clocks), depending upon whether SRL 304 is in a scan or functional mode. SRLs 300, 304 of FIGS. 5A and 5B each include a circuit element 328, 328' for generating a relatively short duration pulse for the respective master latch 308, 308' from the LSSD clock (not shown) as discussed above. In these examples, circuit element 328, 328' is again an AND gate, but could be some other element. An AND gate has been selected for its simplicity in implementation.

In general, the difference between SRL 300 of FIG. 5A and SRL 304 of FIG. 5B is that MUX 316 of SRL 300 is in the data path and deMUX 316' of SRL 304 is in the clock path. When MUX 316 is in the data path, operation is slowed by a delay caused by the MUX. This delay becomes cumulative with similar delays in other SRLs in a chain. SRL 304 of FIG. 5B, on the other hand, does not have such a MUX in the data path and, therefore, does not have the corresponding delay. Although deMUX 316' in the clock path causes a delay, this delay is not cumulative among multiple such SRLs. SRL 304 of FIG. 5B may be used in chips wherein delay caused by MUXs in the data path is desired to be avoided.

Figure 5C:
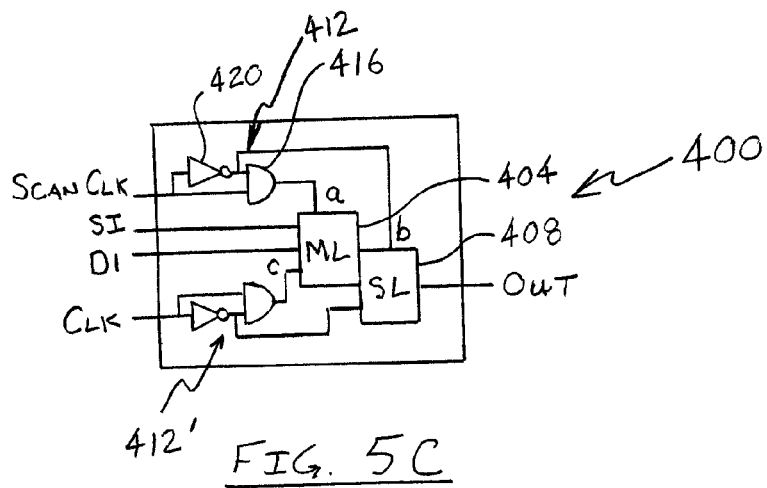
FIG. 5C is a schematic diagram of a non-MUX-type edge-triggered SRL of the present invention.

FIG. 5C shows an exemplary non-MUX-type SRL 400 of the present invention. SRL 400 includes master and slave latches 404, 408 and a circuit element (again, the circuit element is, but not necessarily, an AND gate 416 in combination with an inverter 412) for generating from LSSD scan clock, SCAN CLK, a relatively short duration pulse for latching the master latch during LSSD testing. SRL 400 may also include a functional clock, CLK, to control the functional, as opposed to scanning, operation of the SRL. Unlike SRLs 300, 304 of FIGS. 5A and 5B, respectively, SRL 400 of FIG. 5C has neither a MUX in data path nor a deMUX in clock path. Accordingly, SRL 400 is free of any delays caused by MUX 316 of FIG. 5A and deMUX of FIG. 5B.

Figure 6A:
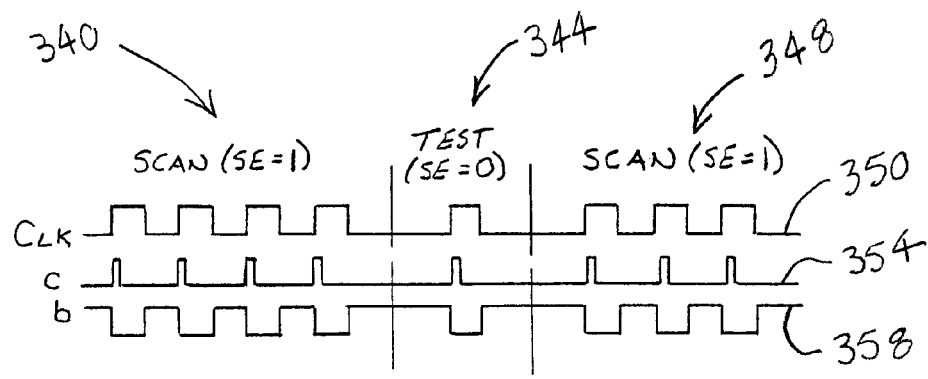
FIGS. 6A and 6B are plots of the states of various signals within the MUX-type edge-triggered SRL of FIG. 5A during, respectively, test operation and functional operation.
Figure 6B:
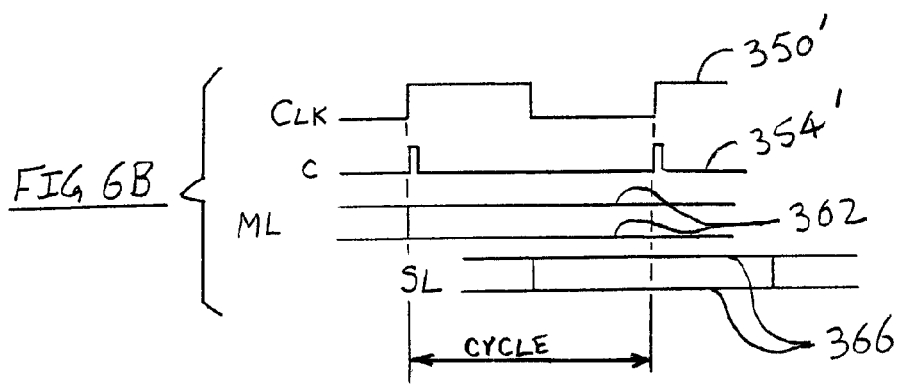

FIGS. 6A and 6B show the plots of various signals within MUX-type SRL 300 of FIG. 5A during, respectively, LSSD test operation and functional operation. LSSD test operation includes toggling of selector signal SE between its high and low states. Referring to FIG. 6A, and also to FIG. 5A, during the scan-in phase 340, selector signal SE may be set to 1 (high), during the (macro) testing phase 344 it may be set to 0 and during the scan-out phase 348, it may be set to 1. In an alternative implementation, the state of selector signal SE may be the inverse of these values. Signal 350 of LSSD clock CLK pulses at a regular rate during scan-in and scan-out phases 340, 348 and pulses once during (macro) testing phase 344. Slave latch clock signal 354 at "c" is simply the inverse of LSSD clock signal CLK. Master clock signal 358 at "b" pulses in relatively short durations soon after each change in state of LSSD clock signal 350 from low to high (leading edge).

During functional operation (FIG. 6B), LSSD clock CLK may be used as the functional clock. In this case, signal 350' clock CLK and master latch clock signal 354' at "c" would be essentially the same as the respective signals 350, 354 discussed above relative to LSSD testing (FIG. 6A). The only difference may generally be the duration of the pulses of LSSD clock signal 350, 350' if a different frequency is used during LSSD testing operation than is used for functional operation. Regarding the states of master and slave latches 308, 312 (FIG. 5A), the master latch will latch the value present at data input D1 at the leading edge of the pulse of master latch clock signal 354'. If the value at data input D1 is high, the state 362 master latch will go high, or stay high if already high from a previous cycle. Conversely, if the value at data input D1 is low, state 362 of master latch 308 will go low, or stay low if already low. Substantially one pulse of signal 350' of clock CLK after this signal goes high, slave latch 312 will latch the value of master latch 308 as the inverted clock signal (not shown) goes high on its leading edge. Like master latch 308, the state 366 of slave latch 312 upon latching the value in the master latch may or may not change depending its state in the immediately prior cycle.

Figure 7A:
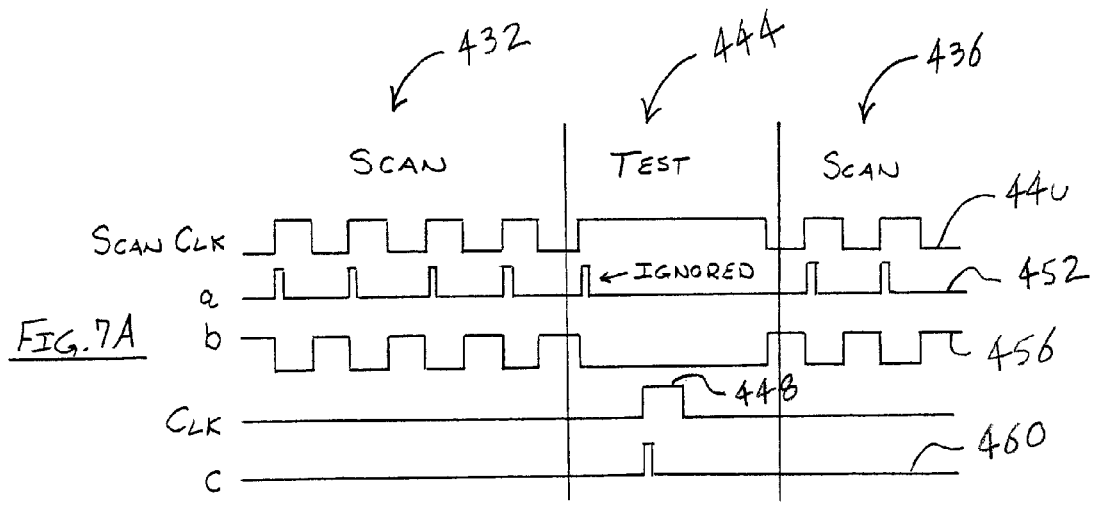
FIGS. 7A and 7B are plots of the states of various signals within the non-MUX-type edge triggered SRL of FIG. 5C during, respectively, test operation and functional operation.
Figure 7B:
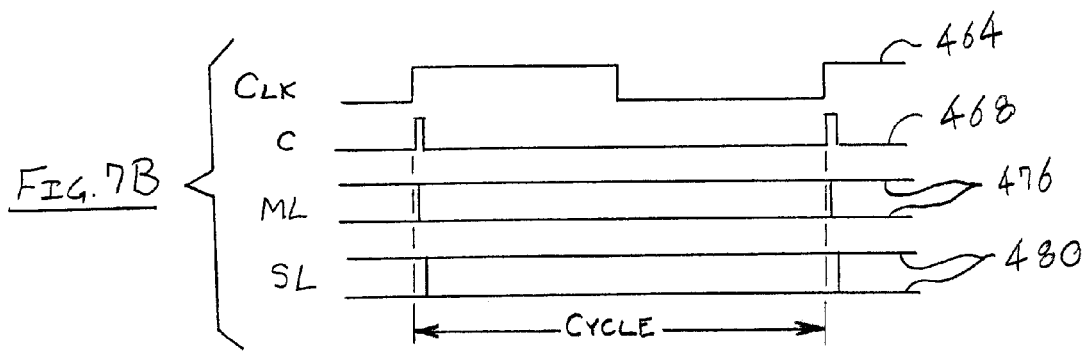

FIGS. 7A and 7B show the plots of various signals within non-MUX-type SRL 400 of FIG. 5C during, respectively, LSSD test operation and functional operation. Referring to FIG. 7A, and also to FIG. 5C, during LSSD test operation, both LSSD scan clock SCAN CLK and functional clock CLK are utilized. During the scan-in and scan-out phases 432, 436, LSSD scan clock SCAN CLK generates a regularly pulsed scan clock signal 440. During the macro testing phase 444, scan clock SCAN CLK may be used in conjunction with a pulse 448 from functional clock CLK. During LSSD testing phase 444, circuit element 412 generates a short pulsed signal 452 at "a" shortly after scan clock signal 440 goes from low to high (leading edge). Slave clock signal 456 at "b", being the inverse of LSSD clock signal 440, is 180° out of phase with the LSSD clock signal. During macro testing phase 444, functional clock CLK may provide a pulsed functional clock signal to a second pulse circuit element 412' so as to provide a short pulsed signal 460 at "c".

During functional operation (FIG. 7B), scan clock signal (not shown) may be continuously high (1). Accordingly, when functional clock CLK generates a regularly pulsed functional clock signal 464 during functional operation, a short pulsed signal 468 at "c" is provided to master latch 404 (FIG. 5C) so as to latch whatever value is seen at data port D1. Since the scan clock signal is high during functional operation, inverter 420 causes slave latch 408 to latch the value in master latch 404 almost immediately after the master latch latches the value on data port D1. Like master and slave latches 308, 312 discussed above relative to FIGS. 6A and 5A, when master and slave latches 404, 408 latch the corresponding values, these values may cause the latches to change state 476, 480, i.e., low to high or vice versa, or remain unchanged in state, depending upon their states during the immediately prior latching cycle.

Figure 8B:
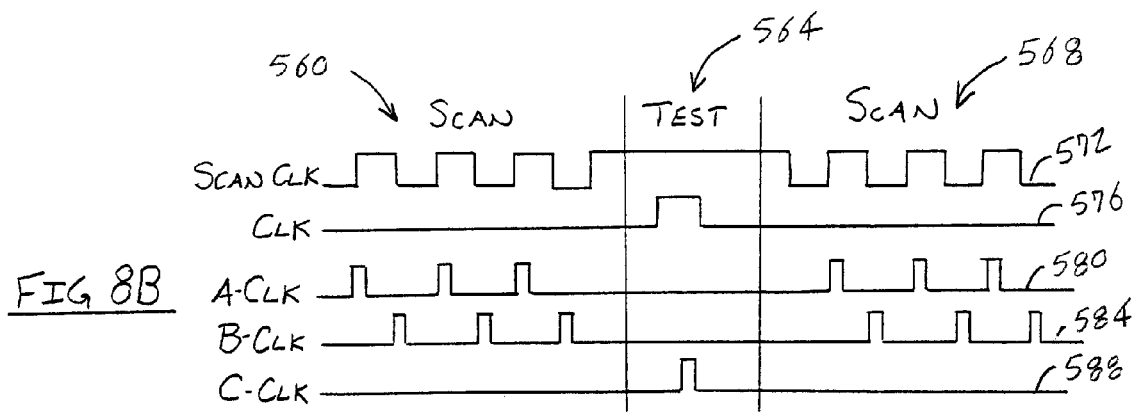
FIGS. 8A and 8B are, respectively, a high-level partial schematic diagram of a device comprising an ASIC containing both edge-triggered SRLs of the present invention and conventional edge-triggered SRLs.
Figure 8A:
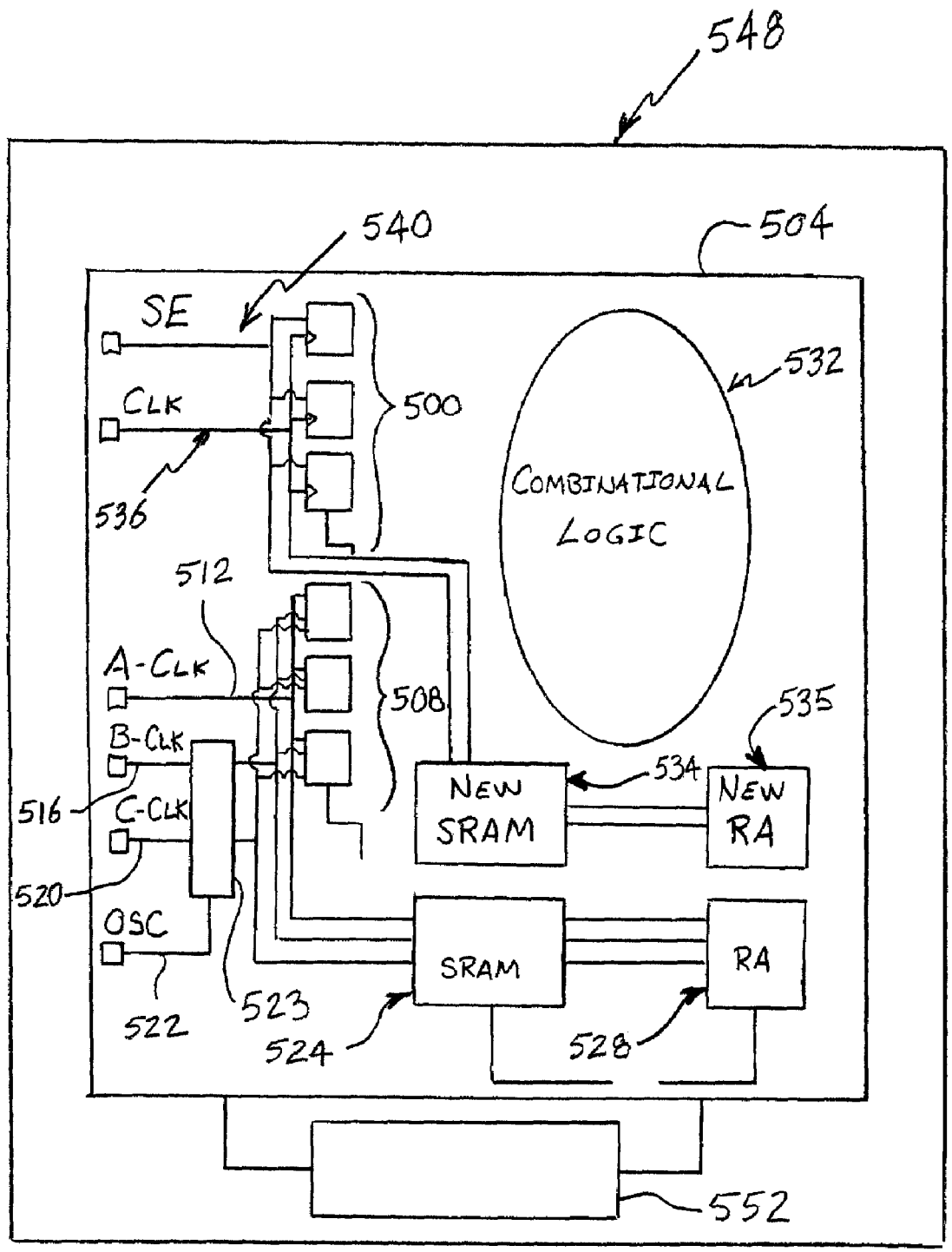

FIG. 8A illustrates that edge-triggered SRLs 500 of the present invention may be integrated into an integrated circuit chip 504, e.g., an ASIC chip or system on chip (SOC), having conventional LSSD SRLs 508 and clock trees, e.g., A-clock, B-clock, C-clock and customer clock trees 512, 516, 520, 522, which utilize one or more clock splitters, e.g., clock splitter 523. Such integration may be desirable, e.g., when existing macros 524, 528 which already contain conventional SRLs 508 are integrated with one or more new circuits/macros utilizing edge-triggered SRLs 500 of the present invention. For example, a new combinational logic circuit 532, a new SRAM 534 and new RA 535 may each be designed for LSSD testing using SRLs 500 of the present invention and only one LSSD scan clock tree 536. However, existing macros e.g., SRAM and RA macros 524, 528, among others, may already be set up with their own scan chains containing conventional SRLs 508 that utilize A-clock, B-clock and C-clock trees 512, 516, 520. Edge-triggered SRLs 500 may be any of SRLs 300, 304, 400 discussed above, or any other SRL that eliminates data flush-through when a single LSSD scan/functional clock tree 536 is used. If edge-triggered SRLs 500 are of the MUX-type, a scan-enable (SE) circuit 540 may be provided.

Integrated circuit chip 504 may be utilized, e.g., in a device 548, which may be any type of device that typically contains such an integrated circuit chip. Examples of these devices include computers, cellular telephones, PDAs, thin clients, televisions, radios, domestic appliances, e.g., digital microwave ovens, dishwashers, clothes dryers and the like, automobiles, digital manufacturing, testing and diagnostic equipment and virtually any digital device for consumer or industrial use. Those skilled in the art will appreciate that in order to understand the present invention it is not necessary to describe the general function of chip 504, nor the details of how the chip interfaces with a power supply 552 and other components (not shown) of device 548 that provide the device's functionality. In addition, those skilled in the art are familiar with the various functions chip 504 may be designed to provide and how to interface the chip with power supply 552 and other components. However, a unique aspect of device 548 is that, as discussed above, it contains the unique SRLs 500 of the present invention that allow designers to reduce clock tree wiring without losing the benefit of the multiple clock tree LSSD methodology and while reducing some of the burden of the wiring layers to create more spaces to wire other components of an integrated circuit.

Figure 1:
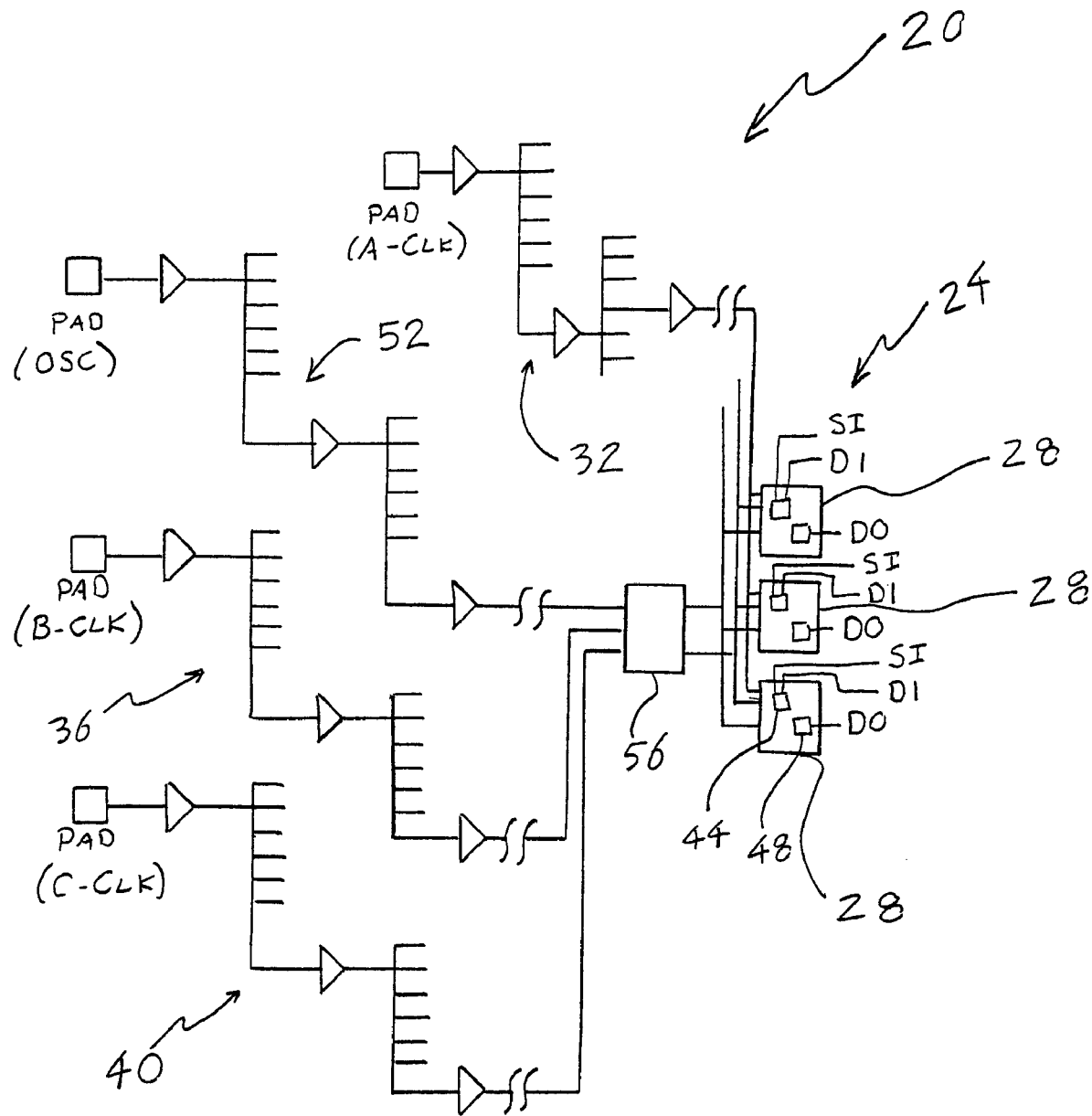
FIG. 1 is a high-level partial schematic diagram illustrating a prior art LSSD boundary scan methodology utilizing three LSSD clock trees.

FIG. 8B shows an example of the various clock signals of, respectively, LSSD scan clock SCAN CLK, functional clock CLK, A-clock A-CLK, B-clock B-CLK, and C-clock C-CLK during the scan-in phase 560, macro testing phase 564 and scan-out phase 568 of LSSD testing of the various macros 524, 528, 532 of chip 504. LSSD scan clock signal 572 and functional clock signal 576 may each be as discussed above relative to FIG. 7A for non-MUX type SRL of FIG. 5C. A-clock, B-clock and C-clock signals 580, 584, 588 may be as they are in conventional LSSD testing, wherein A-clock A-CLK controls latching of master latch 44' (FIG. 3), B-clock B-CLK controls latching of slave latch 48' independent of the latching of the master latch to prevent data flush through, and C-clock C-CLK controls data port D1 (FIG. 1).

While the present invention has been described in connection with several preferred embodiments, it will be understood that it is not so limited. On the contrary, it is intended to cover all alternatives, modifications and equivalents as may be included within the spirit and scope of the invention as defined above and in the claims appended hereto.

The invention claimed is:

1. An integrated circuit, comprising:
   a) a first shift register latch responsive to a first clock signal;
   b) at least one second shift register latch responsive to said first clock signal, wherein said first clock signal at said at least one second shift register latch has a delay relative to said first clock signal at said first shift register, said at least one second shift register latch comprising:
      i) a first latch;
      ii) a second latch in electrical communication with said first latch;
      iii) an input for receiving said first clock signal; and
      iv) a delay-compensation circuit connected between said input and said first latch, said delay-compensation circuit configured to generate a second clock signal as a function of said first clock signal so as to compensate for said delay in said first clock signal.

2. An integrated circuit according to claim 1, further comprising a scan clock tree electrically connected to said input.

3. An integrated circuit according to claim 1, wherein said delay-compensation circuit comprises a pulse generator for generating a first clock pulse for said first latch.

4. An integrated circuit according to claim 3, wherein said pulse generator comprises an AND gate and an inverter.

5. An integrated circuit according to claim 1, wherein said first clock signal comprises a plurality of first pulses each having a first duration and said second clock signal comprises a plurality of second pulses each having a second duration shorter than said first duration.

6. An integrated circuit according to claim 5, wherein each of said plurality of second pulses is generated substantially simultaneously with a corresponding one of said plurality of first pulses.

7. An integrated circuit, comprising:
   a) a first clock tree for receiving a first clock signal having a plurality of pulses each having a first width; and
   b) a first shift register latch responsive to said first clock signal;
   c) at least one second shift register latch responsive to said first clock signal, wherein said first clock signal at said at least one second shift register latch has a delay relative to said first clock signal at said first shift register, said at least one second shift register latch comprising:
      i) a master latch;
      ii) a slave latch in electrical communication with said master latch; and
      iii) a delay-compensation circuit element connected between said first clock tree and said master latch, said delay-compensation circuit element adapted for generating a second clock signal as a function of said first clock signal so as to compensates for said delay in said first clock signal.

8. An integrated circuit according to claim 7 wherein said delay-compensation circuit element is an AND gate.

9. An integrated circuit according to claim 8, wherein said AND gate has a first input for receiving said first clock signal, a second input for receiving a third clock signal that is substantially the inverse of said first clock signal and a first output in electrical communication with said master latch, said first output for outputting said second clock signal.

10. An integrated circuit according to claim 7, further comprising a multiplexer in electrical communication with said master latch.

11. An integrated circuit according to claim 7, comprising at least one first scan chain comprising a plurality of first shift register latches.

12. An integrated circuit according to claim 11, further comprising at least one second scan chain comprising a plurality of second shift register latches, each of said plurality of second shift register latches lacking said delay-compensation circuit element.

13. An integrated circuit according to claim 7, wherein said first clock tree is an LSSD scan clock tree.

14. A device, comprising:
   a) a power supply,
   b) an integrated circuit electrically connected to said power supply, said integrated circuit including a first shift register latch responsive to a first clock signal and at least one second shift register latch responsive to said first clock signal, wherein said first clock signal at said at least one second shift register latch has a delay relative to said first clock signal at said first shift register, said at least one second shift register latch comprising:
      i) a first latch;
      ii) a second latch in electrical communication with said first latch;
      iii) an input for receiving said first clock signal; and
      iv) a delay-compensation circuit connected between said input and said first latch, said delay-compensation circuit configured to generate a second clock signal as a function of said first clock signal so as to compensate for said delay in said first clock signal.

15. A device according to claim 14, further comprising a scan clock tree electrically connected to said input.

16. A device according to claim 14, wherein said delay-compensation circuit comprises a pulse generator for generating a first clock pulse for said first latch.

17. A device according to claim 16, wherein said pulse generator comprises an AND gate and an inverter.

18. A device according to claim 14, wherein said first clock signal comprises a plurality of first pulses each having a first duration and said second clock signal comprises a plurality of second pulses each having a second duration shorter than said first duration.

19. A device according to claim 18, wherein each of said plurality of second pulses is generated substantially simultaneously with a corresponding one of said plurality of first pulses.

20. A device according to claim 14, wherein said at least one shift register latch further comprises a multiplexer in electrical communication with said first latch.

* * * * *